United States Patent [19]

Bussmann

[11] Patent Number: 4,564,394
[45] Date of Patent: Jan. 14, 1986

[54] PREVENTING LATERAL OXIDE GROWTH BY FIRST FORMING NITRIDE LAYER FOLLOWED BY A COMPOSITE MASKING LAYER

[75] Inventor: Egon Bussmann, Munich, Fed. Rep. of Germany

[73] Assignee: Siemens Aktiengesellschaft, Berlin & Munich, Fed. Rep. of Germany

[21] Appl. No.: 630,103

[22] Filed: Jul. 12, 1984

[30] Foreign Application Priority Data

Aug. 11, 1983 [DE] Fed. Rep. of Germany ....... 3329074

[51] Int. Cl.$^4$ ................... H01L 21/22; H01L 21/265
[52] U.S. Cl. ......................................... 148/1.5; 29/571; 29/576 B; 148/175; 148/187; 357/51; 357/91
[58] Field of Search ................. 148/1.5, 175, 187; 357/51, 91; 29/576 B, 571

[56] References Cited

U.S. PATENT DOCUMENTS

| | | | |
|---|---|---|---|
| 4,170,492 | 10/1979 | Bartlett et al. | 148/1.5 |
| 4,257,832 | 2/1981 | Schwabe et al. | 148/187 |
| 4,266,985 | 5/1981 | Ito et al. | 148/1.5 |
| 4,343,657 | 8/1982 | Ito et al. | 148/1.5 |
| 4,356,041 | 10/1982 | Kosa | 148/1.5 |
| 4,373,965 | 2/1983 | Smigelski | 148/1.5 |
| 4,435,446 | 3/1984 | Marston et al. | 156/657 |
| 4,455,193 | 6/1984 | Jeuch et al. | 156/643 |

OTHER PUBLICATIONS

Hui et al., IEEE Trans. Electron Devices, ED-29, 1982, 554–561.
Mizuo et al., Jap. Jour. Appl. Phys., 21 (1982), 272.
Wada et al., Jap. Jour. Appl. Phys., 15 (1976), 1725.
Hezel et al., J. Electrochem. Soc., 129 (1982), 379.

Primary Examiner—Upendra Roy
Attorney, Agent, or Firm—Hill, Van Santen, Steadman & Simpson

[57] ABSTRACT

A limit is placed on the miniaturization of the field oxide structures in the manufacture of semiconductor layer arrangements due to the length of the thick oxide bird's beak. The diffusion of oxidizing agent is suppressed according to the invention by means of a thin diffusion barrier of silicon nitride which also produces no crystal faults in the desired temperature range. The natural oxide on the silicon wafers is also converted into a diffusion barrier as required by means of nitrogen implantation and/or special process management in the nitride deposition.

1 Claim, 2 Drawing Figures

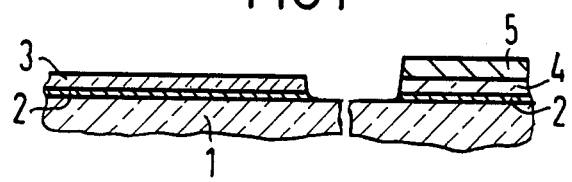
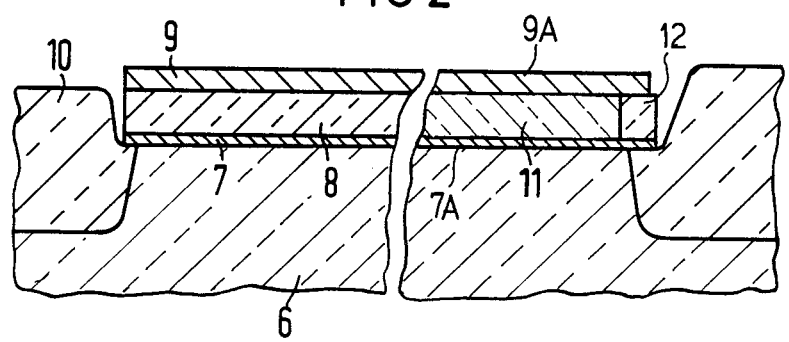

PREVENTING LATERAL OXIDE GROWTH BY FIRST FORMING NITRIDE LAYER FOLLOWED BY A COMPOSITE MASKING LAYER

BACKGROUND OF THE INVENTION

1. Field of the Invention

The invention lies in the field of semiconductor layer arrangements made according to the so-called LOCOS or isoplanar process.

2. Description of the Prior Art

The miniaturization of the field oxide structure has a limit placed on it by the length of the thick oxide bird's beak. Given the same field oxide thickness and mask layer, the minimum length is all the greater, the lower the oxidation temperature is set. The enlargement of the minimum field oxide width with decreasing temperature can be prevented when nitride is employed directly on silicon as a masking layer (Siemens Forschungs- und Entwicklungsbericht, Vol. 10 (1981), pages 357–361).

Nitrogen implantation and thermal nitridation (plasma enhanced) of the silicon wafer before generation of the pure silicon dioxide/nitride masking layer leads to a disappearance of the bird's beak given field oxide thicknesses up to 0.5 μm, particularly given higher oxidation temperatures ($\geq 950°$ C.). This technology is disclosed in IEEE Transactions on Electron Devices, Vol. ED-29, No. 4, pages 554–561.

BRIEF SUMMARY OF THE INVENTION

More particularly, the present invention relates to an improved semiconductor layer arrangement such as is produced by the so-called LOCOS or isoplanar process where, in the layer arrangement, a thin nitride layer is covered by a combination of oxide layer and nitride layer or by a polysilicon layer which serves as masking for a subsequent field oxide structure.

An object of the invention is to create a semiconductor layer arrangement with which extremely fine structures are enabled.

Another object of the invention is to provide an improved process for making such a layer arrangement wherein process steps are eliminated.

Other and further objects, aims, features, purposes, advantages and the like will be apparent to those skilled in the art from the teachings of the present specification taken with the claims.

BRIEF DESCRIPTION OF DRAWINGS

In the Drawings:

FIG. 1 shows in diagrammatic vertical section two modifications of the prior art; and FIG. 2 shows in diagrammatic vertical section two embodiments of the present invention.

DETAILED DESCRIPTION

Given the initially defined semiconductor layer arrangement, these objects are achieved in that then <50 nm thin nitride layer applied to the silicon substrate is a low-pressure nitride layer which is followed by an intermediate layer which is covered by a further nitride layer. The lateral oxide growth is thereby limited, and, thus, a miniaturization of the field oxide structures is enabled. The thick oxide bird's beak opposing the miniaturization of the field oxide structures is thus prevented. The advantage of this execution is founded on the fact that low-pressure nitride is significantly easier to manufacture than, for example, thermal nitride. The process is therewith also significantly simplified.

A further development of the invention consists therein that the thin nitride layer applied to the silicon substrate is a low-pressure nitride layer implanted with nitrogen. As a result of the nitrogen implantation, a pure nitride layer is generated under the natural oxide layer covered by LPCVD [low-pressure chemical vapor deposition] nitride.

A further development of the invention involves an intermediate layer which consists of polysilicon. Such a polysilicon layer is a better diffusion barrier against the oxidizing agent and can be simultaneously employed as a gate electrode.

The method for the manufacture of the semiconductor layer arrangement utilizes a field oxidation which is conducted at temperatures less than about 850° C. and at pressures above about 1 bar. The advantage of such a low-temperature oxidation lies in the reduced growth of crystal faults.

Further, the polysilicon layer can be employed within the framework of the invention as a gate electrode, such as is employable in transistors and/or storage capacitors.

Referring to the drawings, the left-hand variant of FIG. 1 shows a thin nitride layer 2 which has been generated on a silicon substrate 1 by means of plasma enhanced thermal nitridation, or, alternatively, by means of low-voltage nitrogen implantation. Such thin nitride layer 2 is covered by a polysilicon layer 3.

In the right-hand variant of FIG. 1, a nitride layer 2 is covered by a combination of silicon oxide layer 4 and low-pressure nitride layer 5, as is traditional in standard methods (LOCOS technology).

In the left-hand variant of FIG. 2, a low-pressure nitride layer 7 has been deposited on a silicon substrate 6, and the nitride layer 7 has been implanted with nitrogen. Layer 7 is then overlaid by a silicon oxide layer 8 which in turn is covered by a silicon nitride layer 9. An adjacent field oxide structure 10 shows no bird's bill.

In the right-hand variant of FIG. 2, the silicon oxide layer 8 is replaced by a polysilicon layer 11. A nitride layer 7A under the polysilicon layer 11 does not require the nitrogen implantation. Polysilicon layer 11 is covered by a silicon nitride layer 9A.

The difference between, for example, the prior art embodiment of FIG. 1, right-hand variant, and the embodiment of FIG. 2, left-hand embodiment, lies in the different nitride types employed in the layers. In FIG. 1, thin nitride layer 2 is comprised of thermal nitride or produced through implantation whereas in FIG. 2 thin nitride layer 7 or 7a is comprised of low pressure nitride. With regard to implantation, the difference between FIG. 1 and FIG. 2 embodiments lies in that, through an implantation effect (knock-on-implantation), foreign atoms are incorporated into thin nitride layer 2 wnereas through implantation according to FIG. 2, where implantation through the nitride is achieved, no foreign atoms are present. The maximum thickness of layer 2, as produced by the known methods, is about 10 nm, while the maximum thickness of layer 7 or 7a is a matter of design choice and has no such inherent maximum thickness limit owing to its method of production.

The diffusion of oxidizing agent is suppressed according to the invention by means of a thin diffusion barrier of silicon nitride which also produces no crystal faults in the desired temperature range. The natural oxide on the silicon wafers is also converted into a diffusion barrier as required by means of nitrogen implantation and/or special process management in the nitride deposition.

To make an embodiment of the present invention, such as one shown in FIG. 2, the low pressure nitride layer 7 or 7a is deposited on selected surface area(s) of silicon substrate 6. Next, either a silicon oxide layer 8, or a polysilicon layer 11, as chosen, is deposited over nitride layer 7 or 7a. Thereafter, the further nitride layer 9 or 9a is deposited over the silicon oxide layer 8, or the polysilicon layer 11, as the case may be. Finally, phototechnique and etching of the three layers is carried out by employing, for example, RIE (reactive ion etching). If desired, a field implantation can be accomplished before this final step; however, field implantation and low temperature field oxidation using conditions as above indicated, are generally accomplished after this final step. The thickness of the respective layers 8, 11 and 9 is largely random and a matter of design choice. A region 12 comprised of silicon oxide at the exposed edge of layer 11 automatically results as a consequence of the field oxidation.

The arching of the mask edges is prevented by means of a double layer for the prevention of stresses in the silicon, said double layer covering the nitride layer. As was explained with reference to FIG. 2, the double layers consist of polysilicon/nitride or silicon oxide/nitride.

Other and further aims, objects, purposes, advantages, uses and the like for the present invention will be apparent to those skilled in the art from the present specification.

I claim as my invention:

1. In an improved process for producing a semiconductor layer arrangement utilizing the so called LOCOS or isoplanar procedure wherein a first nitride layer is applied to a silicon substrate and is then covered either by (a) a combination layer structure of interventing silicon oxide layers and then a second nitride layer, or (b) by a polysilicon layer structure, either of such layer structures being suitable as a masking for a subsequently applied field oxide structure, the improvement which comprises in combination:

applying said first nitride layer in a thickness less than about 50 nm under low pressure conditions, implanting into said first nitride layer nitrogen, applying over said so implanted nitride layer an intermediate layer selected from the group consisting of silicon oxide and polysilicon, and thereafter covering said intermediate layer with a further layer comprised of silicon nitride.

* * * * *